(12) United States Patent
Lardizabal (10) Patent No.: US 11,979,129 B2
(45) Date of Patent: May 7, 2024

(54) CASCADED LOW-NOISE WIDEBAND ACTIVE PHASE SHIFTER

(71) Applicant: Raytheon Company, Waltham, MA (US)

(72) Inventor: Steven M. Lardizabal, Westford, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/648,279

(22) Filed: Jan. 18, 2022

(65) Prior Publication Data

US 2023/0231542 A1    Jul. 20, 2023

(51) Int. Cl.
  *H03H 11/20*    (2006.01)
  *H03H 7/19*     (2006.01)
  *H03K 5/00*     (2006.01)

(52) U.S. Cl.
  CPC .............. *H03H 11/20* (2013.01); *H03H 7/19* (2013.01); *H03K 2005/00286* (2013.01)

(58) Field of Classification Search
  None
  See application file for complete search history.

(56) References Cited

U.S. PATENT DOCUMENTS

| | | | |
|---|---|---|---|
| 5,502,421 A * | 3/1996 | Nakahara | H03H 11/245 333/167 |
| 10,819,321 B1 | 10/2020 | Zaiden et al. | |
| 2020/0028500 A1* | 1/2020 | Cheng | H03H 7/20 |

FOREIGN PATENT DOCUMENTS

| | | | |
|---|---|---|---|
| FR | 2750546 A1 * | 1/1998 | ............ H03H 11/18 |
| IN | 201741014751 A | 11/2018 | |
| JP | 49130154 A | 12/1974 | |
| JP | 5976136 U | 5/1984 | |

OTHER PUBLICATIONS

International Search Report and English Translation of Box V of the Written Opinion dated May 16, 2023, received for corresponding PCT Application No. PCT/US2023/010957, pp. 12.
David Viveirosjr et al, "T Turntable All-Pass MMIC Active Phase Shifter," IEEE Transactions on Microwave Theory and Techniques, Aug. 2002, pp. 5, vol. 50, No. 8.

* cited by examiner

*Primary Examiner* — Daniel C Puentes
(74) *Attorney, Agent, or Firm* — Kinney & Lange, P.A.

(57) ABSTRACT

Apparatus and associated methods relate to a low-noise wideband active phase shifter. The low-noise wideband active phase shifter includes first and second transconductance cells, a fixed LC series network and a tunable LC series network configured to form an all-pass lattice network. The first and second transconductance cells, each include a transistor, a feedback network, and a transistor biasing network. The transistor has an input terminal and an output terminal. The negative feedback network electrically couples the input and output terminals of the transistor. The biasing network provides input and output biasing of the transistor. The fixed LC series network connects between the first and the second transconductance cells. The tunable LC series network connects between the first and the second transconductance cells.

14 Claims, 7 Drawing Sheets

CASCADED LOW-NOISE WIDEBAND ACTIVE PHASE SHIFTER

BACKGROUND

Modern RADAR and wireless communications often rely on electrical phase steering of antenna patterns. Such phase-steering is performed by exciting different antennas in an array with electronic signals that have a specific phase relation with one another. These phase relations (e.g., signals of a common frequency but having different delay relations with respect to one another) are generated by shifting the phase of these electronic signal by different angular amounts. Coordination the relative phases with the geometric locations of the antenna result in a electromagnetic wave directed in a specific direction. Precise control of the relative phases of these signals results in precise control of beam direction. Such precision becomes increasingly difficult to accomplish as desired bandwidths and frequencies of operation increase.

Traditionally, phase shifting has been performed in various manners. For example, switched-line phase control simply switches between different lengths (and therefore time delays) amongst different transmission lines. Switched termination of a transmission line causes differences in reflection, which in turn causes a phase change in the sum of the incident and reflected waves. Switched loading of a transmission line changes the impedance characteristics of such a line, and therefore causes a change in the speed of signal propagation, which causes a change in the phase at the output of such a transmission line. High- and/or low-pass filters are used to cause phase changes in a signal as well. All these traditional methods of phase shifting are essentially passive (except for the use of switches), and therefore incur losses as the signal passes therethrough. Furthermore, some of these traditional phase-shifting techniques, such as, for example high- and/or low-pass filtering, have small bandwidths within which constant phase-shifting occurs.

SUMMARY

Apparatus and associated methods relate to a low-noise wideband active phase shifter including first and second transconductance cells, a fixed LC series network, and a tunable LC series network. Each of the first and second transconductance cells include a transistor, a feedback network, and input and output biasing networks. The transistor has an input terminal and an output terminal. The feedback network electrically couples the input and output terminals of the transistor. The input and output biasing networks provide input and output biasing of the transistor, respectively. The fixed LC series network is connected between the first and the second transconductance cells. The tunable LC series network is connected between the first and the second transconductance cells. The fixed LC series network and the tunable LC series network form an all-pass lattice network with the first and second transconductance cells.

Some embodiments relate to a cascaded low-noise wideband phase shifter including a cascaded plurality of low-noise wideband active phase shifting stages. Each low-noise wideband active phase shifting stages includes first and second transconductance cells. Each of the first and second transconductance cells include a transistor, a feedback network, and input and output biasing networks. The transistor has an input terminal and an output terminal. The feedback network electrically couples the input and output terminals of the transistor. The input and output biasing networks provide input and output biasing of the transistor, respectively. The fixed LC series network is connected between the first and the second transconductance cells. The tunable LC series network is connected between the first and the second transconductance cells. The fixed LC series network and the tunable LC series network form an all-pass lattice network with the first and second transconductance cells.

DETAILED DESCRIPTION

Apparatus and associated methods relate to a low-noise wideband active phase shifter. The low-noise wideband active phase shifter includes first and second transconductance cells, a fixed LC series network and a tunable LC series network configured to form an all-pass lattice network. The first and second transconductance cells, each include a transistor, a feedback network, and a transistor biasing network. The transistor has an input terminal and an output terminal. The negative feedback network electrically couples the input and output terminals of the transistor. The biasing network provides input and output biasing of the transistor. The fixed LC series network connects between the first and the second transconductance cells. The tunable LC series network connects between the first and the second transconductance cells.

Figure 1:
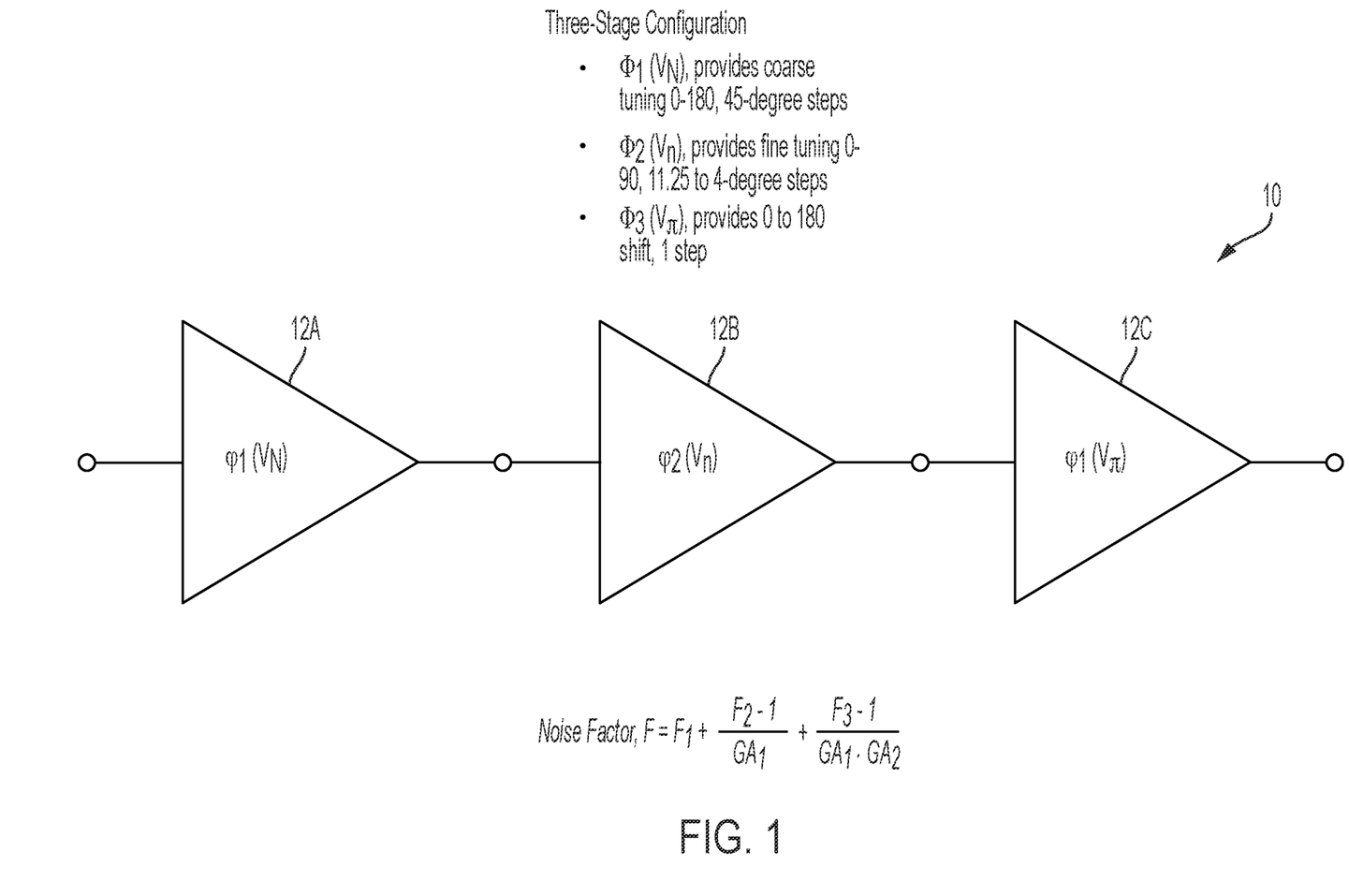
FIG. 1 is a block diagram of three-stage configuration of a wideband active phase shifter having 360 degrees of control.

FIG. 1 is a block diagram of three-stage configuration of a wideband active phase shifter having 360 degrees of control. In FIG. 1, cascaded low-noise wideband phase shifter 10 includes first-stage phase shifter 12A, second-stage phase shifter 12B and third-stage phase shifter 12C connected in a cascaded (i.e., serial) fashion. Each of first-, second-, and third-stage phase shifters 12A, 12B, and 12C contribute to the performance of cascaded low-noise wideband phase shifter 10. The total phase shift that results from a signal passing through cascaded low-noise wideband phase shifter 10 is the sum of the phase shift that results from the signal passing through each of first-, second-, and third-stage phase shifters 12A, 12B, and 12C. As indicated in FIG. 1, first-stage phase shifter 12A provides coarse tuning of 0, 45, 90, and 135 degrees of phase shift. Second-stage phase shifter 12B provides find tuning between 0 and 45 degrees in 4-degree intervals. Thus, after a signal is passed through both the first- and second-stage phase shifters 12A and 12B, the resulting signal can be phase shifted between 0 and 180 degrees with 4-degree resolution. Third-stage phase shifter 12C provides either 0 degrees or 180 degrees of additional phase shift. Thus, after a signal is passed through all first-, second- and third-stage phase shifters 12A, 12B, and 12C, the resulting signal can be phase shifted between 0 and 360 degrees with 4-degree resolution.

The noise factor F of cascaded low-noise wideband phase shifter 10 is given by the following expression:

$$F = F_1 + \frac{F_2 - 1}{GA_1} + \frac{F_3 - 1}{GA_1 \cdot GA_2} \quad (1)$$

where $F_1$, $F_2$, and $F_3$ are noise factors and $GA_1$, $GA_2$, and $GA_3$ are gain factors of first, second, and third-stage phase shifters 12A, 12B, and 12C, respectively. The noise factor $F_2$ of second-stage phase shifter 12B is reduced by the gain factor $GA_1$ of first-stage phase shifter 12A. The noise factor $F_3$ of third-stage phase shifter 12C is reduced by the product of gain factors $GA_1$ and $GA_2$ of first- and second-stage phase shifters 12A and 12B. Thus, increasing the gain of first-stage phase shifters 12A results in decreasing the overall noise factor F of cascaded low-noise wideband phase shifter 10, by decreasing the noise factors $F_2$, and $F_3$ of second- and second-stage phase shifters.

The frequency response of cascaded low-noise wideband phase shifter 10 is the product of the frequency responses of first-, second-, and third-stage phase shifters 12A, 12B, and 12C. Thus, to obtain a wideband frequency response, each of first-, second-, and third-stage phase shifters 12A, 12B, and 12C must have wideband frequency response. Such wideband frequency response in a phase shifter, such as first-, second-, and third-stage phase shifters 12A, 12B, and 12C, means that the phase shift of signals passed through these phase shifters is substantially constant over a wideband of frequencies.

Figure 2:
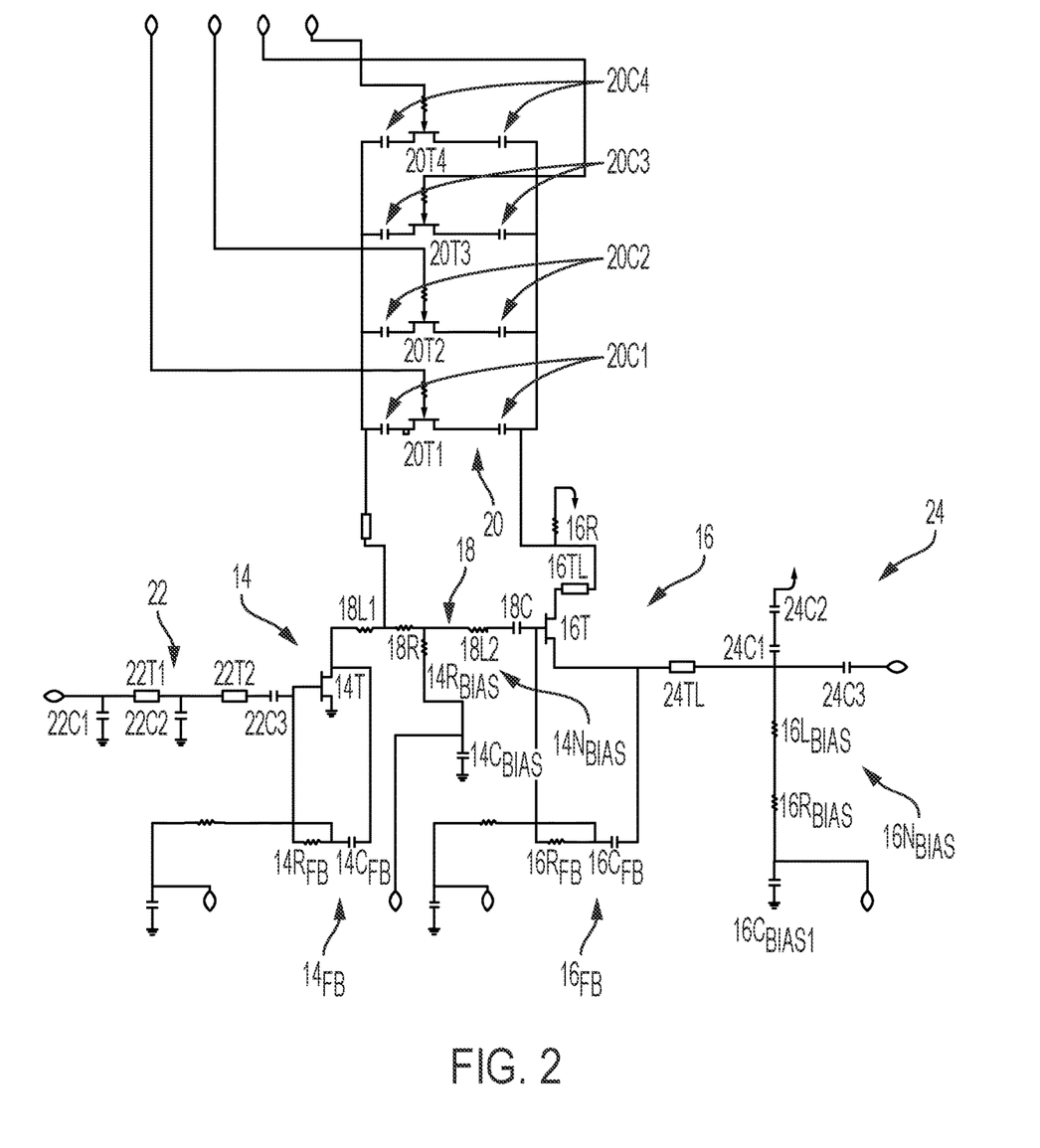
FIG. 2 is a schematic diagram of single stage of a wideband active phase shifter.

FIG. 2 is a schematic diagram of single stage of a wideband active phase shifter. In FIG. 2, low-noise wideband active phase shifter 12 includes first- and second-stage transconductance cells 14 and 16, respectively, and fixed and tunable LC series networks 18 and 20, respectively. First- and second-stage transconductance cells 14 and 16 and fixed and tunable LC series networks 18 and 20 are interconnected to form an all-pass lattice network. Low-noise wideband active phase shifter 12 forms an impedance bridge with each of fixed and tunable LC series networks 18 and 20 connected between first- and second-stage transconductance cells 14 and 16. Fixed LC network 18 includes inductors 18L1 and 18L2, resistor 18R, and capacitor 18C. Tunable LC series network 20 is tunable via selection of one or more series capacitor pairs 20C1-20C4 via selection transistor 20T1-20T4, In the depicted embodiment, each of first- and second-stage transconductance cells 14 and 16 includes transistor 14T and 16T, respectively. Transistors 14T and 16T are high-frequency FETs or BJTs, such as, for example, FETs or BJTs that have high-mobility carriers (e.g., using GaAs, GaN, SiGe, etc.). In the depicted embodiment, transistors 14T and 16T are field-effect transistors (FETs) configured in common-source configurations. First-stage transconductance cell 14 has a gate input terminal, a source terminal that is directly connected to ground, and a drain output terminal. Second-stage transconductance cell 16 has a gate input terminal, a source terminal connected to ground via transmission line 16TL and resistor 16R$_S$, and a drain output terminal.

Each of first- and second-stage transconductance cells 14 and 16 has an RC parallel feedback paths 14FB and 16FB, respectively. Resistor 14R$_{RB}$ of RC parallel feedback path 14FB is connected between a gate of FET 14T and capacitor 14C$_{RB}$, which is also connected to a drain for FET 14T. In a similar fashion, resistor 16R$_{FB}$ of RC parallel feedback path 16FB is connected between a gate of FET 16T and capacitor 16C$_{FB}$, which is also connected to a drain for FET 16T. Feedback paths 14FB and 16FB provide negative feedback so as to flatten the gain/frequency curve and broaden the phase and amplitude responses of first- and second-stage transconductance cells 14 and 16, respectively.

Furthermore, feedback paths 14FB and 16FB are used to provide bias injection for first- and second-stage transconductance cells 14 and 16, respectively. A gate bias (e.g., input bias) for first-stage transconductance cell 14 is injected at the series connection point of resistor 14R$_{FB}$ and capacitor 14C$_{FB}$ of feedback path 14FB. A gate bias for second-stage transconductance cell 16 is injected at the series connection point of resistor 16R$_{RB}$ and capacitor 16C$_{FB}$ of feedback path 16FB. Resistors 14R$_{FB}$ and 16R$_{FB}$ are large value resistors so as to provide isolation between any applied bias (e.g., a voltage bias) and the gate nodes of FETs 14T and 16T, respectively. First- and second-stage transconductance cells are biased such that low-noise wideband active phase shifter 12 has a gain greater than unity from input to output. Such gain permits input-referred noise of subsequent stages of low-noise wideband active phase shifter 12B and 12C to be reduced by the gain of the first-stage low-noise wideband active phase shifter 12A. Similarly, gain of second-stage low-noise wideband active phase shifter 12B causes further reduction of input-referred noise of third-stage low-noise wideband active phase shifter 12C.

First- and second-stage transconductance cells 14 and 16 are coupled to one another via both fixed and tunable LC series networks 18 and 20. Fixed LC series network 16 includes inductor 18L1, resistor 18R, inductor 18L2, and capacitor 18C series connected between the output of first-stage transconductance cell 14 (i.e., drain of transistor 14T) and the input of second-stage transconductance cell 16 (i.e., gate of transistor 16T). Drain biasing of first-stage transconductance cell 14 is performed using fixed LC series network 18. Drain biasing of first-stage transconductance cell 14 is injected at the node connecting inductor 18L1 with resistor 18R of fixed LC series network 18. A first-stage drain biasing network 14N$_{BIAS}$ includes resistor 14R$_{BIAS}$ and 14C$_{BIAS}$. Resistor 14R$_{BIAS}$ is coupled between the bias injection point of fixed LC series network 16 described above and capacitor 14C$_{BIAS}$, which extends between resistor 14R$_{BIAS}$ and ground. Drain biasing of second-stage transconductance cell 16 is performed using a drain biasing network 16N$_{BIAS}$ that includes resistor 16R$_{BIAS}$, capacitors 16C1$_{BIAS}$, 16C2$_{BIAS}$, and 16C3$_{BIAS}$, and inductor 16L$_{BIAS}$.

Tunable LC series network 20 can share an inductor with fixed LC series network and further includes tuning capacitor pairs 20C1-20C4 extending between the output of first-stage transconductance cell 14 (via inductor 18L1 of fixed LC network 18) and the source of transistor 16T (via transmission line 16TL). Tuning capacitor pairs 20C1-20C4 provide tuning of tunable LC series network 20. Tuning is accomplished by selection of tuning capacitor pairs 20C1-20C4 via selection transistors 20T1-20T4. Each embodiment of low-noise wideband active phase shifter 12A, 12B, and 12C use different capacitance values of tuning capacitor pairs 20C1-20C4 so as to provide different amounts of precision and dynamic range of phase shift tuning that is produced. As described above, in one embodiment, the first stage provides relatively coarse phase tuning in 45 degree steps; the second stage providing fine tuning in 4 degree steps; the third stage providing 0 or 180 degree tuning. The resulting dynamic range of such three cascaded low-noise wideband active phase shifter 12A, 12B, and 12C can provide a full 360 degrees of phase tuning in 4 degree steps.

In addition to the all-pass lattice network described above, low-noise wideband active phase shifter 12 includes input passive network 22 and an output passive network 24. Input passive network 22 includes transmission lines 22TL1 and 22TL2, capacitors 22C1 and 22C2 that couple transmission lines 22TL1 and 22TL2 to ground GND, and series capacitor 22C3, through which the input signal is AC coupled to the input of first-stage transconductance cell 14. Output passive network 24 includes transmission line 24TL, capacitors 24C1 and 24C2, and AC coupling capacitor 24C3.

Figure 3:
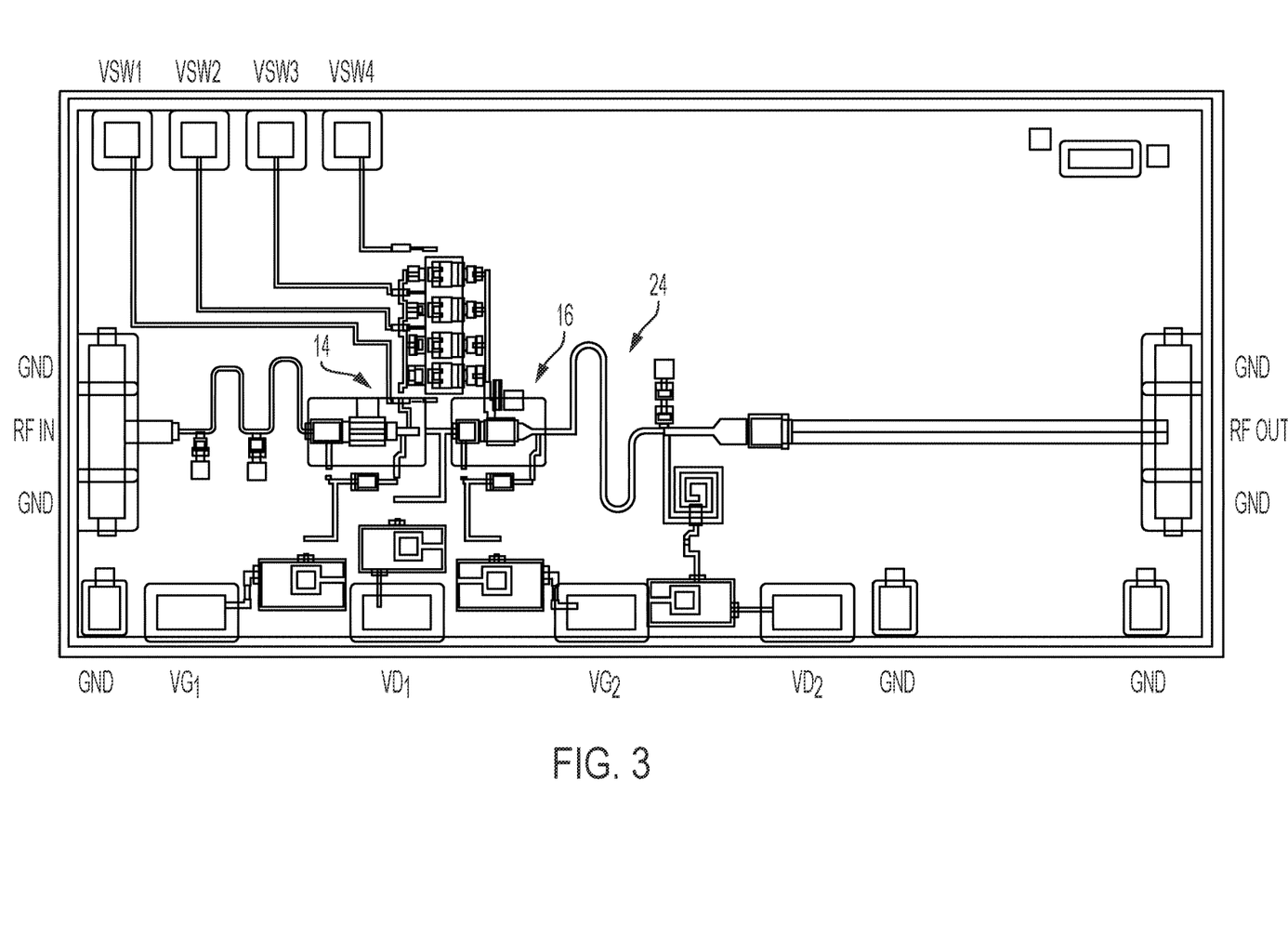
FIG. 3 is a circuit layout of a single stage of a wideband active phase shifter.

FIG. 3 is a circuit layout of a single stage of a wideband active phase shifter. In FIG. 3, low-noise wideband active phase shifter 12 has various input and output pad connections, including: RF input pad, RF output pad, gate biasing pad VG1 and drain biasing pad VD1 for first-stage transconductance cell 14, gate biasing pad VG2 and drain biasing pad VD2 for first-stage transconductance cell 16, tuning capacitor selection pads VSW1-4, and ground pads GND. In FIG. 3, each of the components described above with reference to FIG. 2 are depicted as they can be seen from a plan view of an embodiment of a circuit-board assembly. First- and second-stage transconductance cells 14 and 16 are located between RF input pad and RF output pad. Note that the transmission line 24TL of the output network 24 has impedance controlled by ground strips that run alongside transmission line 24TL.

Figure 4:
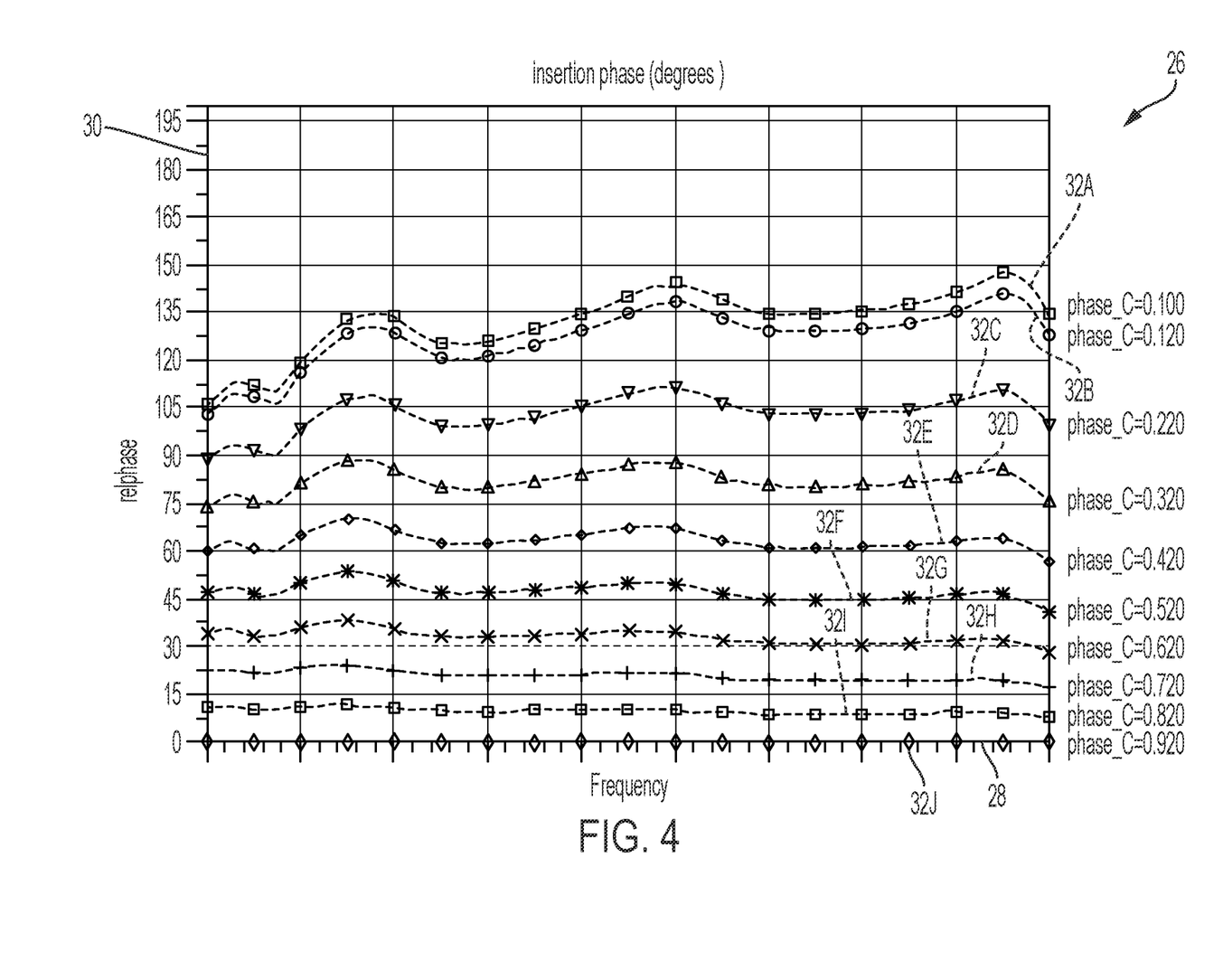
FIG. 4 is a graph of relative phase as a function of frequency using various values of feedback capacitance in the wideband active phase shifter of FIGS. 2 and 3.

FIG. 4 is a graph of relative phase as a function of frequency using various values of feedback capacitance in the wideband active phase shifter of FIGS. 2 and 3. In FIG. 4, graph 26 includes horizontal axis 28, vertical axis 30, and phase/frequency relations 32A-32J. Horizontal axis 28 is indicative of frequency of a signal input to the RF input pad/port of low-noise wideband active phase shifter 12. Vertical axis 30 is indicative of relative phase shift of the signal at the RF output pad/port of low-noise wideband active phase shifter 12. Phase/frequency relations 32A-32J are indicative of the relationship between relative phase and frequency of waveforms phase shifted by low-noise wideband active phase shifter 12 using various values of tuning capacitances. These various values of tuning capacitance are obtained by selecting various combinations of tuning capacitor pairs 20C1-20C4. In graph 26, phase/frequency relations 32A-32J, correspond to tuning capacitance values of: 0.100, 0.120, 0.220, 0.320. 0.420, 0.520, 0.620, 0.720, 0.820, and 0.920 pF. As indicated in graph 26, each of phase-frequency relations 32A-32J is constant within a fraction of its nominal value over a wide span of frequencies. In some embodiments, each of phase/frequency relations 32A-32J is within ±5, 10, or 15 percent of its nominal value over a frequency band of an octave, two octave, or even a decade or more. Such flat frequency responses can be obtained at high frequencies, such as 30, 50, or even 80 GHz.

FIGS. 5A-5D are graphs of S-parameter/frequency and noise-figure/frequency relations using various values of feedback capacitance of the wideband active phase shifter of FIGS. 2 and 3. In FIGS. 5A-5D, graphs 34A-34D depict S-parameter/frequency relations for forward transmission, input return loss, output return loss, and noise-figure/frequency relation, respectively. In graphs 34A-34D, each of horizontal axes 36A-36D is indicative of frequency. In graph 34A, vertical axis 38A is indicative of forward transmission as measured in decibels dB. In graphs 34A, a series of forward-transmission/frequency relations is depicted. These forward-transmission/frequency relations correspond to various values of tuning capacitances as selected by various combinations of tuning capacitor pairs 20C1-20C4. As indicated by these forward-transmission/frequency relations, low-noise wideband active phase shifter 12 provides gain across a wide band of frequencies, while providing a substantially constant phase shift of the signal input thereto.

Figure 5A:
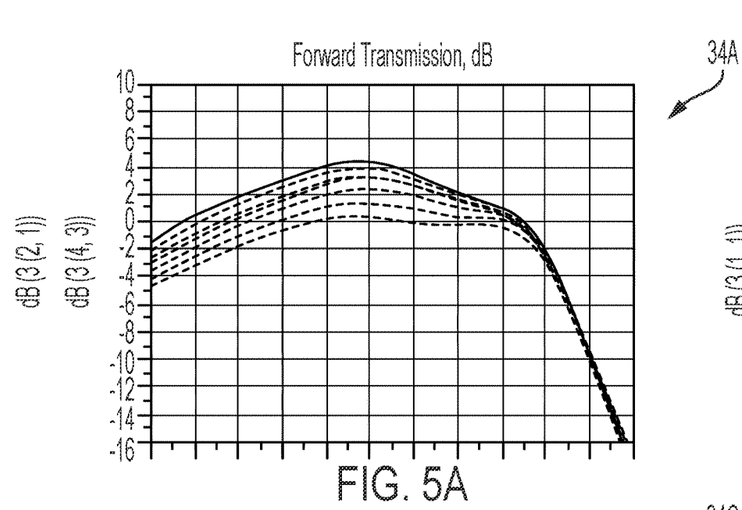
FIGS. 5A-5D are graphs of S-parameter/frequency and noise-figure/frequency relations using various values of feedback capacitance of the wideband active phase shifter of FIGS. 2 and 3.
Figure 5B:
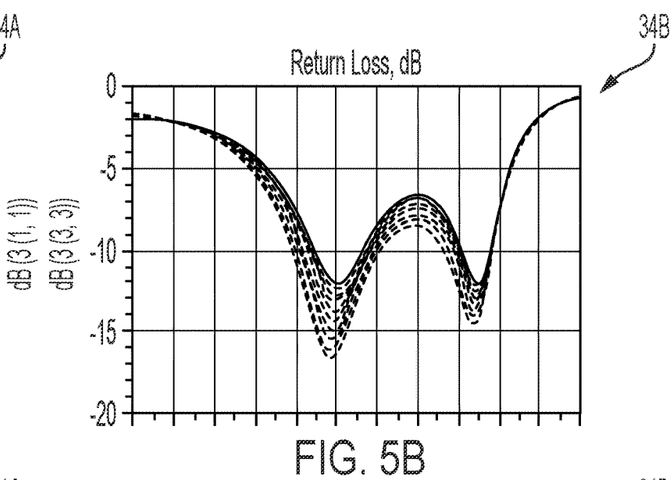

In graph 34B, vertical axis 38B is indicative of input return loss as measured in decibels dB. In graphs 34B, a series of input-return-loss/frequency relations is depicted. These input-return-loss/frequency relations correspond to various values of tuning capacitances as selected by various combinations of tuning capacitor pairs 20C1-20C4. As indicated by these input-return-loss/frequency relations, return loss of signals input to low-noise wideband active phase shifter 12 are relatively modest over the bandwidth of frequencies that low-noise wideband active phase shifter 12 provides substantially constant phase shifting of the signal input thereto.

Figure 5C:
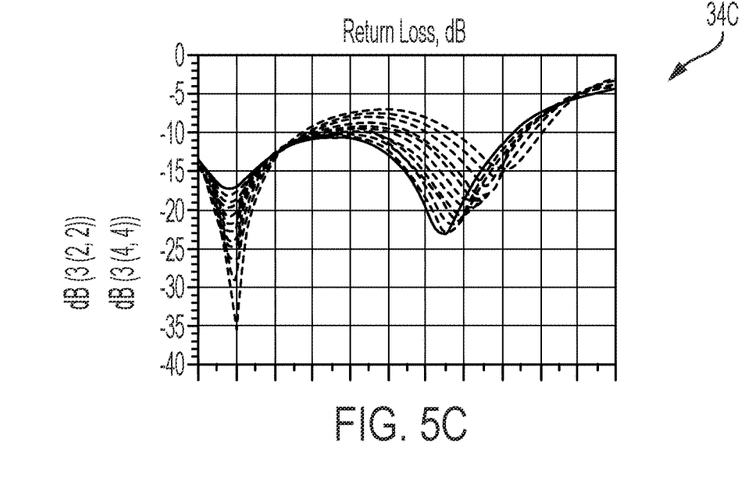

Again, in graph 34C, vertical axis 38C is indicative of output return loss as measured in decibels dB. In graphs 34C, a series of output-return-loss/frequency relations is depicted. These output-return-loss/frequency relations correspond to various values of tuning capacitances as selected by various combinations of tuning capacitor pairs 20C1-20C4. As indicated by these return-loss/frequency relations, return loss of signals input to low-noise wideband active phase shifter 12 are relatively modest over the bandwidth of frequencies that low-noise wideband active phase shifter 12 provides substantially constant phase shifting of the signal input thereto.

Figure 5D:
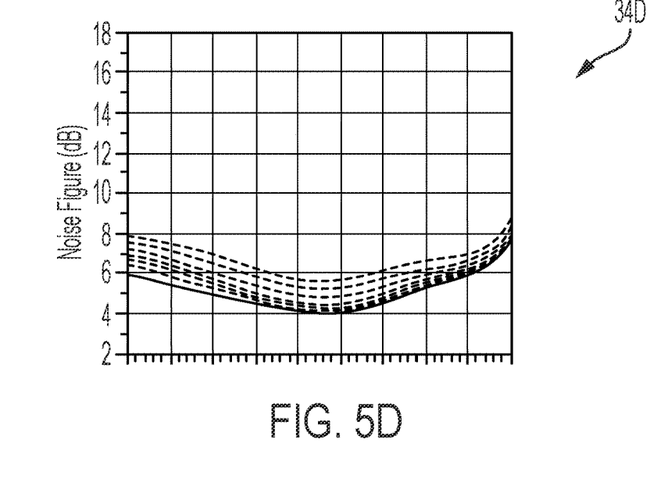

In graph 34D, vertical axis 38D is indicative of noise figure as measured in decibels dB. In graphs 34D, a series of noise-figure/frequency relations is depicted. These noise-figure/frequency relations correspond to various values of tuning capacitances as selected by various combinations of tuning capacitor pairs 20C1-20C4. As indicated by these noise-figure/frequency relations, noise figure is relatively modest over the bandwidth of frequencies that low-noise wideband active phase shifter 12 provides substantially constant phase shifting of the signal input thereto.

Figure 6:
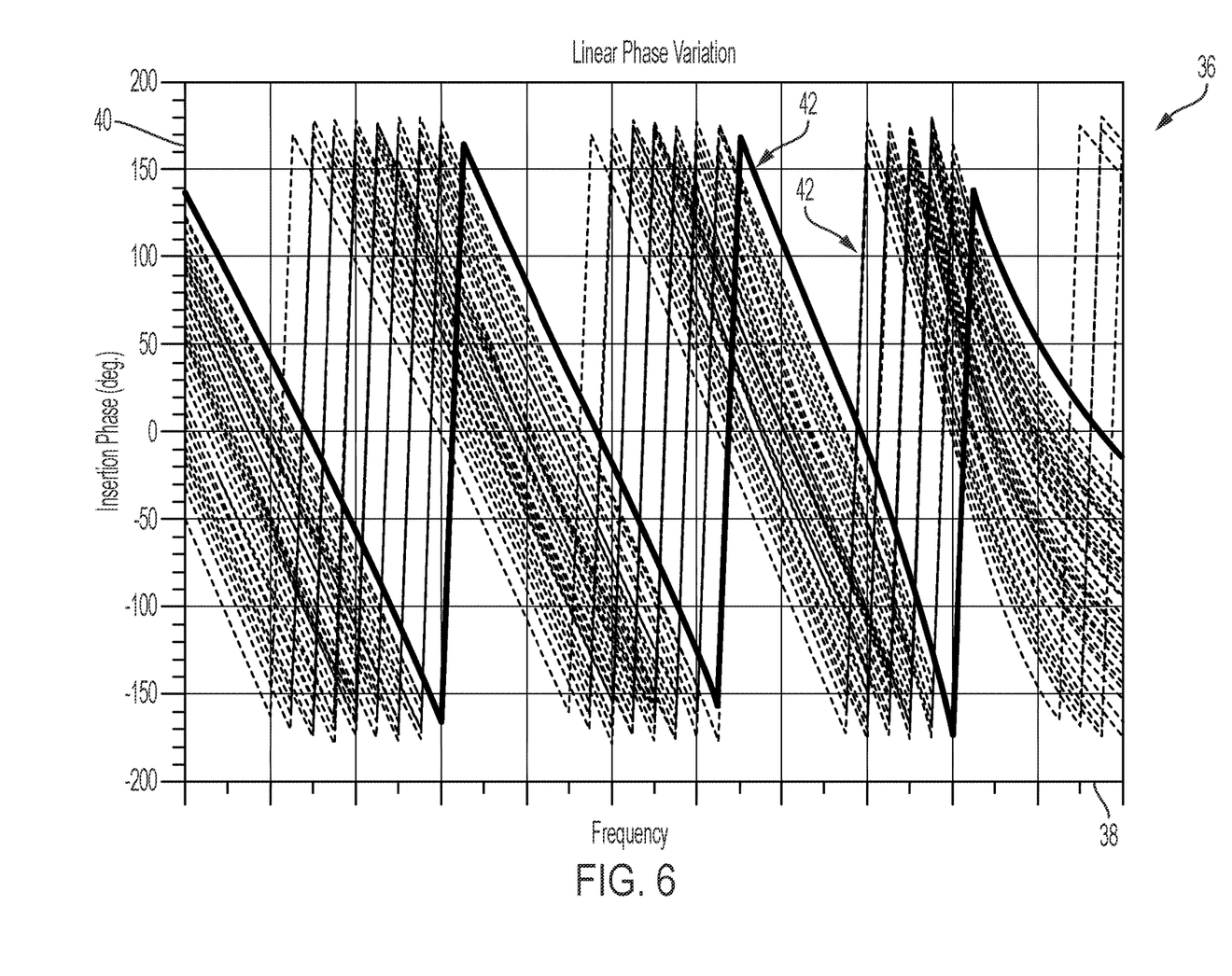
FIG. 6 is a graph or linear phase as a function of frequency using various values of feedback capacitance of two cascaded wideband active phase shifters of FIGS. 2 and 3.

FIG. 6 is a graph or linear phase as a function of frequency using various values of feedback capacitance of two cascaded wideband active phase shifters of FIGS. 2 and 3. In FIG. 6, graph 36 includes horizontal axis 38, vertical axis 40, and phase-variation/frequency relations 42. Horizontal axis 38 is indicative of frequency, and vertical axis is indicative of phase. Each of phase-variation/frequency relations 42 represents the linear phase of the signal at the output of two cascaded stages of low-noise wideband active phase shifter 12, such as for example first- and second-stages of low-noise wideband active phase shifter 12A and 12B. Phase-variation/frequency relations 42 correspond to various values of tuning capacitances as selected by various combinations of tuning capacitor pairs 20C1-20C4 for each of the two stages 12A and 12B. As can be seen, first-stage low-noise wideband active phase shifter 12A provides the large phase steps, while second-stage low-noise wideband active phase shifter 12A provides the small phase steps that form groups within each of the large phase steps. Such a graph shows how cascading low-noise wideband active phase shifters 12 can provide both coarse phase shifting control as well as fine phase shifting control.

Figure 7A:
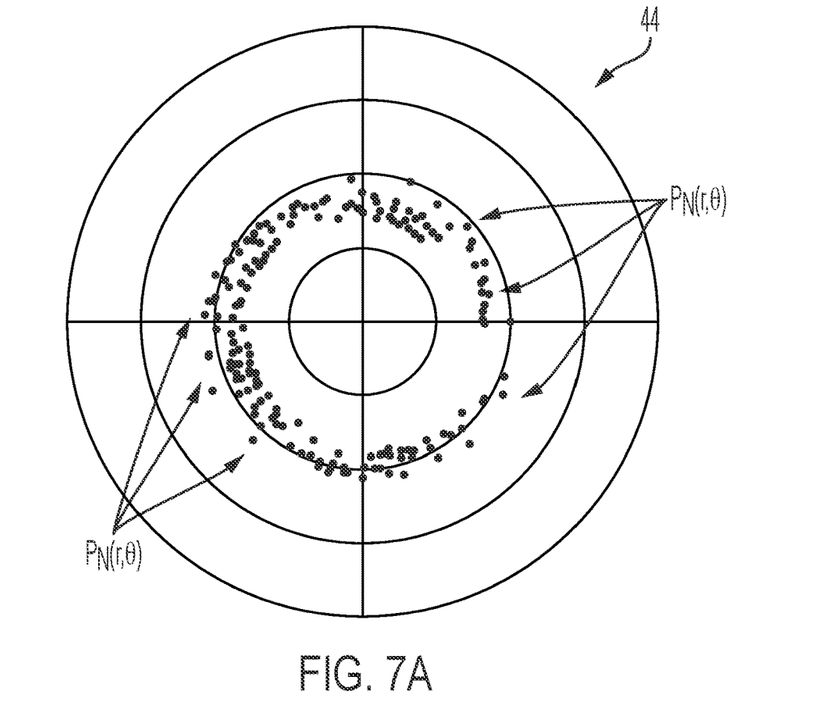
FIGS. 7A and 7B are diagrams depicting gain and phase for various combinations of feedback capacitances of three wideband active phase shifters of FIGS. 2 and 3 cascaded as shown in FIG. 1.
Figure 7B:
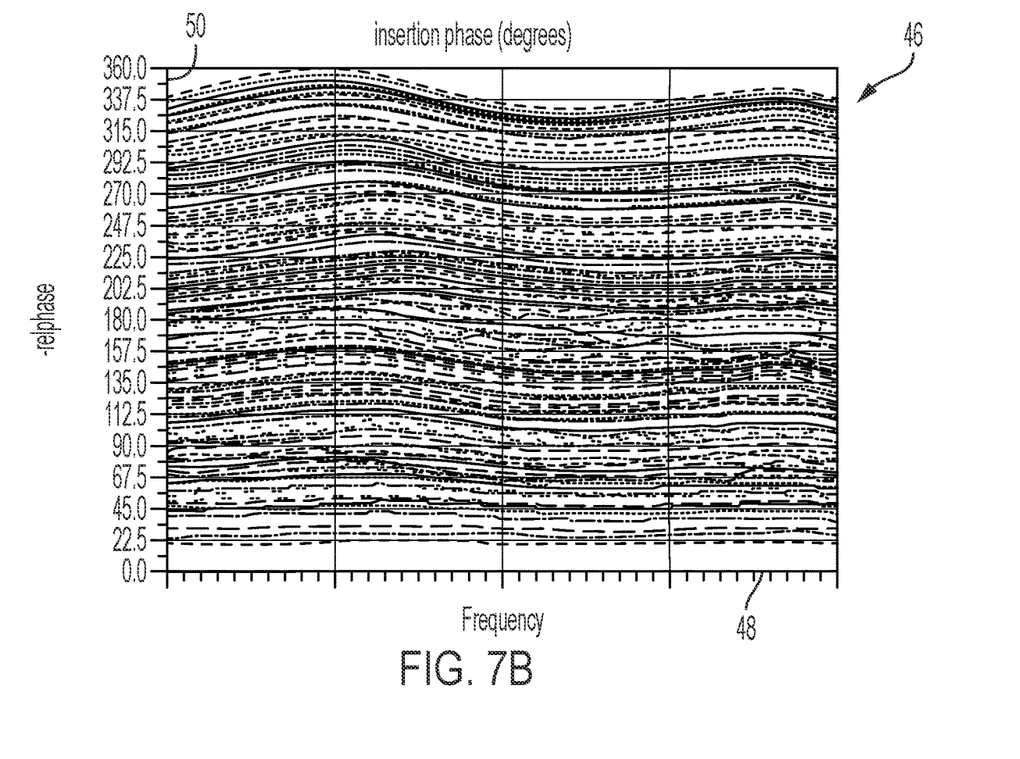

FIGS. 7A and 7B are diagram depicting gain and phase for various combinations of feedback capacitances of three wideband active phase shifters of FIGS. 2 and 3 cascaded as shown in FIG. 1. In FIG. 7, polar diagram 44 has a series of gain/phase data points $P_N(r,\theta)$ distributed thereabout. Each gain/phase data points $P_N(r,\theta)$ corresponds to a unique selection of tuning capacitances selected for use in the three stages of cascaded low-noise wideband phase shifter 10. As indicated in polar diagram 44, the span of phases that can result from such a span of selected tuning capacitances is a full 360 degrees. Furthermore, the gain of each of these phase shifted signals (as represented by the distance of each of the gain/phase data points $P_N(r,\theta)$ from the origin) is within a small fraction of a nominal gain value. In some embodiments, the gain distribution of the gain/phase data points $P_N(r,\theta)$ are within ±10, 15, 20, or 30% of the nominal or average gain of the gain/phase data points $P_N(r,\theta)$.

In FIG. 7B, graph 46 depicts the same data shown in graph 42, but in a phase/frequency relation manner. Graph 44 includes horizontal axis 48, vertical axis 50 and phase frequency relations $\theta_N(f)$. Each of phase frequency relations $\theta_N(f)$ corresponds to a unique selection of tuning capacitances selected for use in the three stages of cascaded low-noise wideband phase shifter 10. As indicated in graph 46, phase frequency relations $\theta_N(f)$ not only span a full 360 degree phase span, but are substantially constant over a large bandwidth of frequencies. Moreover, phase frequency relations $\theta_N(f)$ are well behaved in that one of phase frequency relations $\theta_N(f)$ does not cross (e.g., go from indicating a phase shift smaller than another to indicating a phase greater than that other) another of phase frequency relations $\theta_N(f)$ over the large bandwidth of frequencies over which it is substantially constant. Such well-behaved phase-frequency relations permits operation over a large bandwidth of frequencies while maintaining phase relation with other signals phase shifted differently. Such well-behaved signals can be used in phased array antennas to perform multi-beam transmissions at different distinct directions, for example.

DISCUSSION OF POSSIBLE EMBODIMENTS

The following are non-exclusive descriptions of possible embodiments of the present invention.

Apparatus and associated methods relate to a low-noise wideband active phase shifter including first and second transconductance cells, a fixed LC series network, and a tunable LC series network. Each of the first and second transconductance cells include a transistor, a feedback network, and input and output biasing networks. The transistor has an input terminal and an output terminal. The feedback network electrically couples the input and output terminals of the transistor. The input and output biasing networks provide input and output biasing of the transistor, respectively. The fixed LC series network is connected between the first and the second transconductance cells. The tunable LC series network is connected between the first and the second transconductance cells. The fixed LC series network and the tunable LC series network form an all-pass lattice network with the first and second transconductance cells.

The system of the preceding paragraph can optionally include, additionally and/or alternatively, any one or more of the following features, configurations and/or additional components:

A further embodiment of the foregoing system, wherein the feedback network can include a feedback resistor in series with a feedback capacitor. The feedback capacitor is also connected to the output terminal of the transistor, and the feedback resistor is also connected to the input terminal of the transistor.

A further embodiment of any of the foregoing systems, wherein the input bias network can provide an input biasing signal to a series connection point of the feedback resistor and the feedback capacitor.

A further embodiment of any of the foregoing systems, wherein the fixed LC series network can electrically couple the output terminal of the transistor of the first transconductance cell and the input terminal of the transistor of the second transconductance cell.

A further embodiment of any of the foregoing systems, wherein the transistor of each of the first and second transconductance cells can be a field effect transistor having a source terminal, a gate terminal functioning as the input terminal, and a drain terminal functioning as the output terminal.

A further embodiment of any of the foregoing systems, wherein the tunable LC series network can electrically couple the drain terminal of the field effect transistor of the first transconductance cell and the source terminal of the field effect transistor of the second transconductance cell.

A further embodiment of any of the foregoing systems, wherein the tunable LC series network can include a plurality of selectable tuning capacitor pairs, and a selection transistor electrically coupled between each of the plurality of selectable tuning capacitor pairs, thereby providing selectable tuning to the tunable LC series network.

A further embodiment of any of the foregoing systems, wherein the plurality of selectable tuning capacitor pairs can be coupled in parallel fashion.

A further embodiment of any of the foregoing systems can further include first and second output biasing networks for the transistors of the first and second transconductance cells, respectively. The first output biasing network injects bias current into drain of the transistor of the first transconductance cell via the fixed LC series network connected thereto.

A further embodiment of any of the foregoing systems, wherein the second output biasing network can inject bias current into drain of the transistor of the second transconductance cell.

Some embodiments relate to a cascaded low-noise wideband phase shifter including a cascaded plurality of low-noise wideband active phase shifting stages. Each low-noise wideband active phase shifting stages includes first and second transconductance cells. Each of the first and second transconductance cells include a transistor, a feedback network, and input and output biasing networks. The transistor has an input terminal and an output terminal. The feedback network electrically couples the input and output terminals of the transistor. The input and output biasing networks provide input and output biasing of the transistor, respectively. The fixed LC series network is connected between the first and the second transconductance cells. The tunable LC series network is connected between the first and the second transconductance cells. The fixed LC series network and the tunable LC series network form an all-pass lattice network with the first and second transconductance cells.

The method of the preceding paragraph can optionally include, additionally and/or alternatively, any one or more of the following features, configurations and/or additional components:

A further embodiment of the foregoing method, wherein a first of the cascaded plurality of low-noise wideband active phase shifting stages can provide coarse tuning between zero and 180 degrees of phase shift.

A further embodiment of any of the foregoing methods, wherein a second of the cascaded plurality of low-noise wideband active phase shifting stages can provide fine tuning between zero and 11.25 degrees of phase shift.

A further embodiment of any of the foregoing methods, wherein a third of the cascaded plurality of low-noise wideband active phase shifting stages can provide binary tuning of zero or 180 degrees of phase shift.

A further embodiment of any of the foregoing methods, wherein the input bias network can be coupled a series connection point of the feedback resistor and the feedback capacitor.

A further embodiment of any of the foregoing methods, wherein the fixed LC series network can electrically couple the output terminal of the transistor of the first transconductance cell and the input terminal of the transistor of the second transconductance cell.

A further embodiment of any of the foregoing methods, wherein the transistor of each of the first and second transconductance cells can be a field effect transistor having a source terminal, a gate terminal functioning as the input terminal, and a drain terminal functioning as the output terminal.

A further embodiment of any of the foregoing methods, wherein the tunable LC series network can electrically couple the drain terminal of the field effect transistor of the first transconductance cell and the source terminal of the field effect transistor of the second transconductance cell.

A further embodiment of any of the foregoing methods, wherein the tunable LC series network can include a plurality of selectable tuning capacitor pairs and a selection transistor electrically coupled between each of the plurality of selectable tuning capacitor pairs, thereby providing selectable tuning to the tunable LC series network.

A further embodiment of any of the foregoing methods, wherein the plurality of selectable tuning capacitor pairs can be coupled in parallel fashion.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A low-noise wideband active phase shifter comprising:
   first and second transconductance cells, each including:
      a field-effect transistor FET having a source terminal, a gate terminal functioning as and input terminal, and a drain terminal functioning as an output terminal;
      a feedback network that electrically couples the input and output terminals of the FET; and
      input and output biasing networks that provide input and output biasing of the FET, respectively;
   a fixed LC series network connected between the output terminal of the FET of the first transconductance cell to the input terminal of the FET of the second transconductance cell; and
   a tunable capacitor network connected between the output terminal of the FET of the first transconductance cell and the source terminal of the FET of the second transconductance cell,
   wherein the fixed LC series network and the tunable capacitor network form an all-pass lattice network with the first and second transconductance cells.

2. The low-noise wideband active phase shifter of claim 1, wherein the feedback network includes a feedback resistor in series with a feedback capacitor, the feedback capacitor also connected to the output terminal of the FET, and the feedback resistor also connected to the input terminal of the FET.

3. The low-noise wideband active phase shifter of claim 2, wherein the input bias network provides an input biasing signal to a series connection point of the feedback resistor and the feedback capacitor.

4. The low-noise wideband active phase shifter of claim 1, wherein the tunable capacitor network includes a plurality of selectable tuning capacitor pairs and a selection FET electrically coupled between each of the plurality of selectable tuning capacitor pairs, thereby providing selectable tuning to the tunable capacitor network.

5. The low-noise wideband active phase shifter of claim 4, wherein the plurality of selectable tuning capacitor pairs is coupled in parallel fashion.

6. The low-noise wideband active phase shifter of claim 1,
   wherein, for each of the first and second transconductance cells, the output biasing network injects bias current into drain of the FET.

7. The low-noise wideband active phase shifter of claim 1, wherein the second output biasing network injects bias current into drain of the FET of the second transconductance cell.

8. A cascaded low-noise wideband phase shifter comprising:
   a cascaded plurality of low-noise wideband active phase shifting stages, each including:
      first and second transconductance cells, each including:
         a field-effect transistor FET) having an input terminal and an output terminal;
         a feedback network that electrically couples the input and output terminals of the FET; and
         input and output biasing networks that provide input and output biasing of the FET, respectively;
      a fixed LC series network connected between the output terminal of the FET of the first transconductance cell to the input terminal of the FET of the second transconductance cell; and
      a tunable capacitor network connected between the output terminal of the FET of the first transconductance cell and the source terminal of the FET of the second transconductance cell,
      wherein the fixed LC series network and the tunable capacitor network form an all-pass lattice network with the first and second transconductance cells.

9. The cascaded low-noise wideband phase shifter of claim 8, wherein a first of the cascaded plurality of low-noise wideband active phase shifting stages provides coarse tuning between zero and 180 degrees of phase shift.

10. The cascaded low-noise wideband phase shifter of claim 8, wherein a second of the cascaded plurality of low-noise wideband active phase shifting stages provides fine tuning between zero and 11.25 degrees of phase shift.

11. The cascaded low-noise wideband phase shifter of claim 8, wherein a third of the cascaded plurality of low-noise wideband active phase shifting stages provides binary tuning of zero or 180 degrees of phase shift.

12. The cascaded low-noise wideband phase shifter of claim 8, wherein the input bias network is coupled a series connection point of the feedback resistor and the feedback capacitor.

13. The cascaded low-noise wideband phase shifter of claim 8, wherein the tunable capacitor network includes a plurality of selectable tuning capacitor pairs and a selection FET electrically coupled between each of the plurality of selectable tuning capacitor pairs, thereby providing selectable tuning to the tunable capacitor network.

14. The cascaded low-noise wideband phase shifter of claim 13, wherein the plurality of selectable tuning capacitor pairs is coupled in parallel fashion.

\* \* \* \* \*